United States Patent [19]

Kitagawa et al.

[11] Patent Number: 5,156,981
[45] Date of Patent: Oct. 20, 1992

[54] METHOD OF MAKING A SEMICONDUCTOR DEVICE OF A HIGH WITHSTAND VOLTAGE

[75] Inventors: Mitsuhiko Kitagawa; Yoshio Yokota, both of Tokyo; Kazuo Watanuki, Yokohama; Yoshinari Uetake, Sagamihara; Kazunobu Nishitani; Tsuneo Ogura, both of Yokohama, all of Japan

[73] Assignee: Kabushiki Kaisha Toshiba, Kawasaki, Japan

[21] Appl. No.: 334,257

[22] Filed: Apr. 6, 1989

[30] Foreign Application Priority Data

Apr. 8, 1988 [JP] Japan .................................. 63-86607

[51] Int. Cl.$^5$ .............................................. H01L 49/00
[52] U.S. Cl. .......................................... 437/6; 437/82; 437/247
[58] Field of Search .................. 437/6, 82, 247, 29; 357/37, 38, 39

[56] References Cited

U.S. PATENT DOCUMENTS

| | | | |
|---|---|---|---|
| 4,236,169 | 11/1980 | Nakashima et al. | 357/38 |
| 4,278,476 | 7/1981 | Bartkoe et al. | 357/38 |
| 4,356,503 | 10/1982 | Schafer | 357/38 |
| 4,381,952 | 5/1983 | Rosen | 437/27 |
| 4,537,919 | 11/1970 | Bittmann | 437/6 |
| 4,551,744 | 11/1985 | Suzulci | 357/38 |

FOREIGN PATENT DOCUMENTS 0206136 6/1986 European Pat. Off. .
54-113274 4/1979 Japan .

OTHER PUBLICATIONS

DESC Confrence Record pp. 903-907 Ogura et al. "Low Switching Loss, High Power Gate Turnoff Thyristors with N-Buffer and New Anode Short-Structure" Apr. 11-18, 1988.

Primary Examiner—Tom Thomas
Attorney, Agent, or Firm—Finnegan, Henderson, Farabow, Garrett and Dunner

[57] ABSTRACT

Phosphorus is doped into one of the major surfaces of an n-type silicon semiconductor substrate, and boron is doped into the other major surface. Thereafter, the structure is diffused into the surface regions of the substrate at a high temperature and for a long time, so that an n-buffer layer is formed in the first major surface, and a p-base layer is formed in the second major surface. Impurity of n-type is diffused into the p-base layer, to form an n-emitter layer. Impurity of p-type is diffused into the n-buffer layer, to selectively form p-emitter layer. Further, n-type impurity is diffused into the n-buffer layer, to form n-type anode short layer.

2 Claims, 15 Drawing Sheets

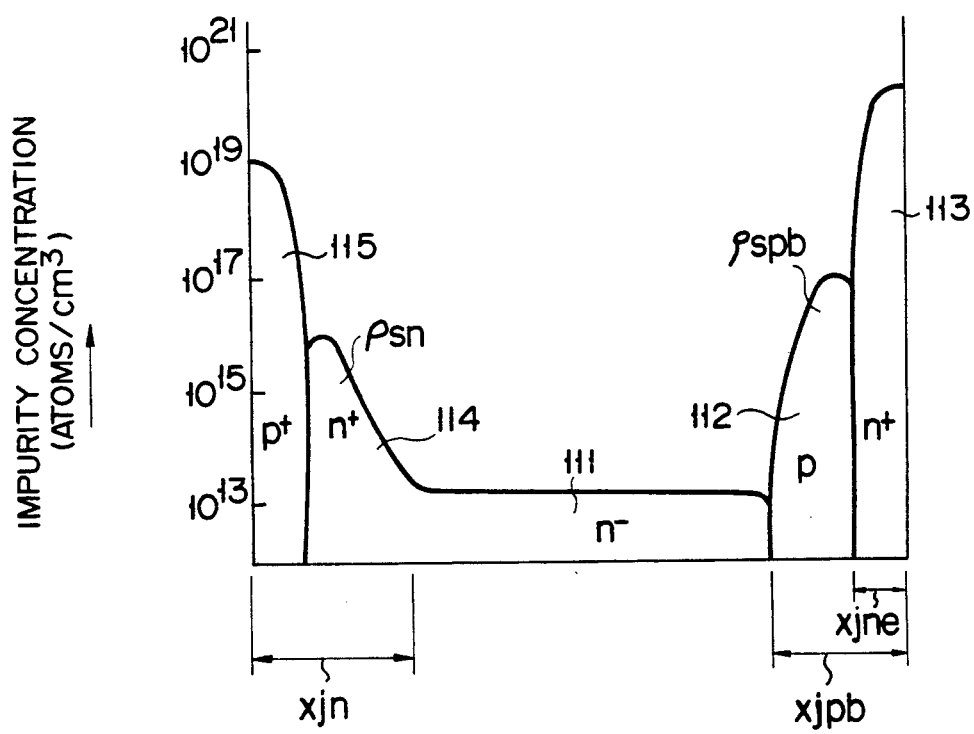
F I G. 2

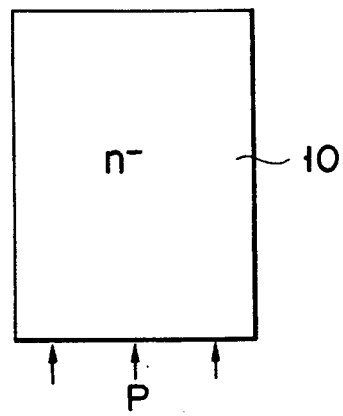
F I G. 4A
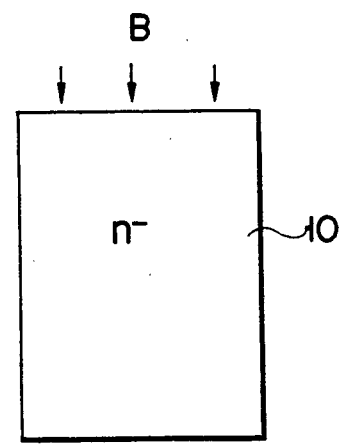
F I G. 4B
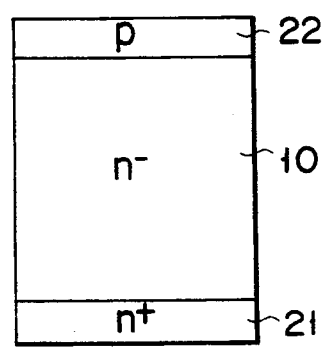
F I G. 4C
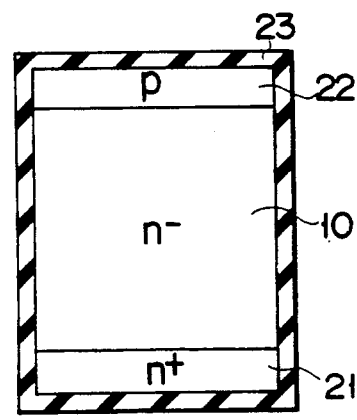
F I G. 4D
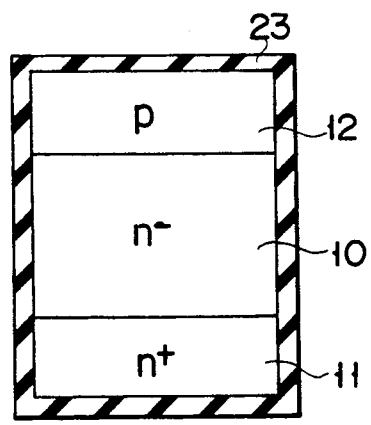
F I G. 4E
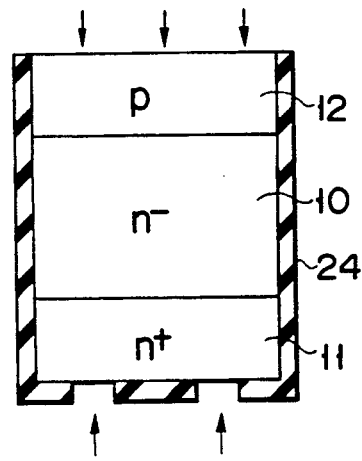
F I G. 4F

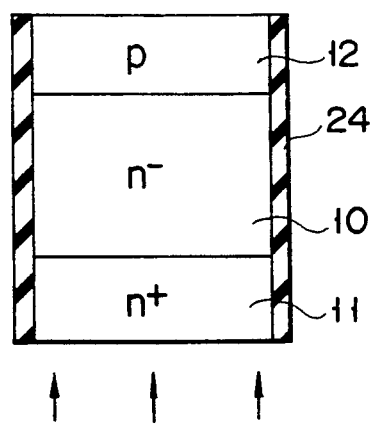
F I G. 4G
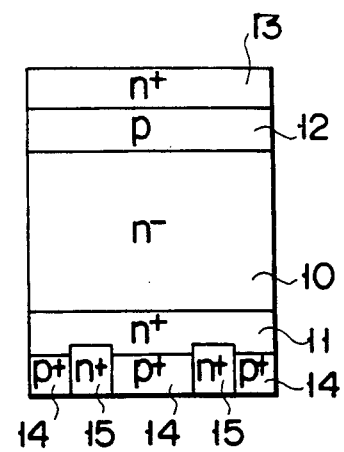
F I G. 4H
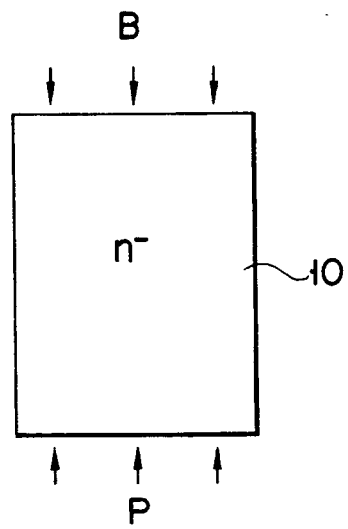
F I G. 5A
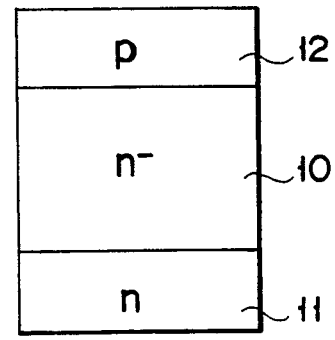
F I G. 5B
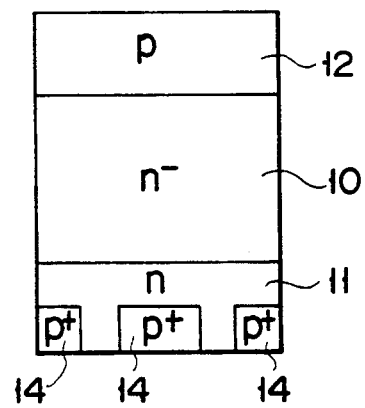
F I G. 5C
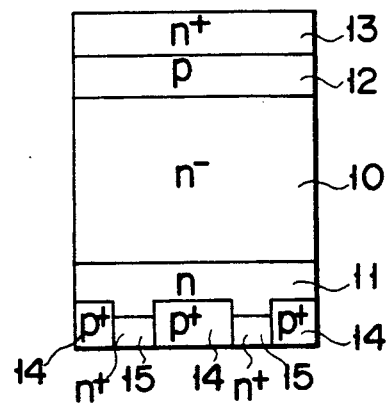
F I G. 5D

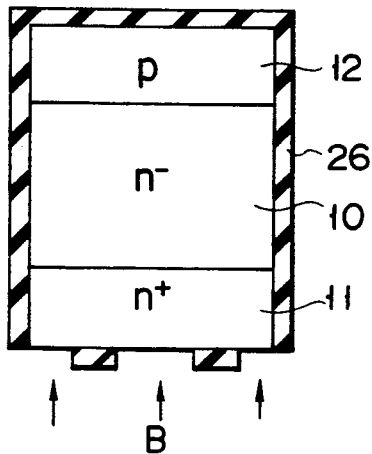
F I G. 6A
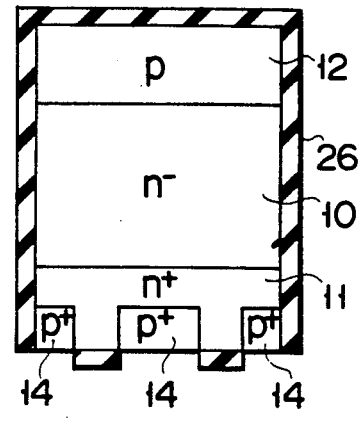
F I G. 6B
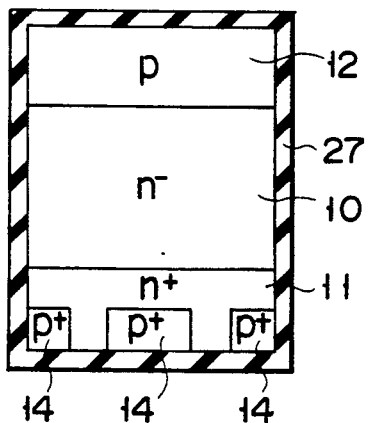
F I G. 6C
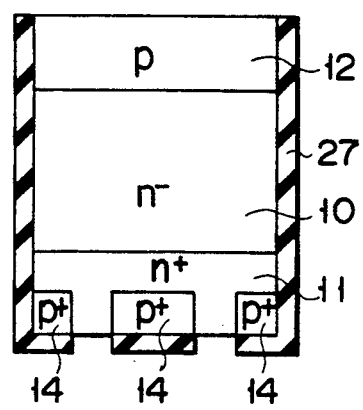
F I G. 6D
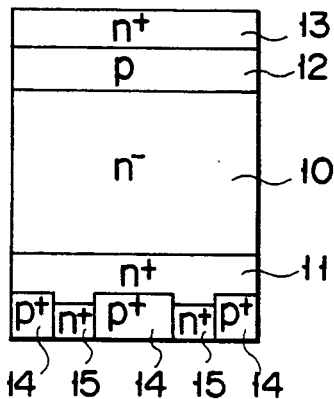
F I G. 6E

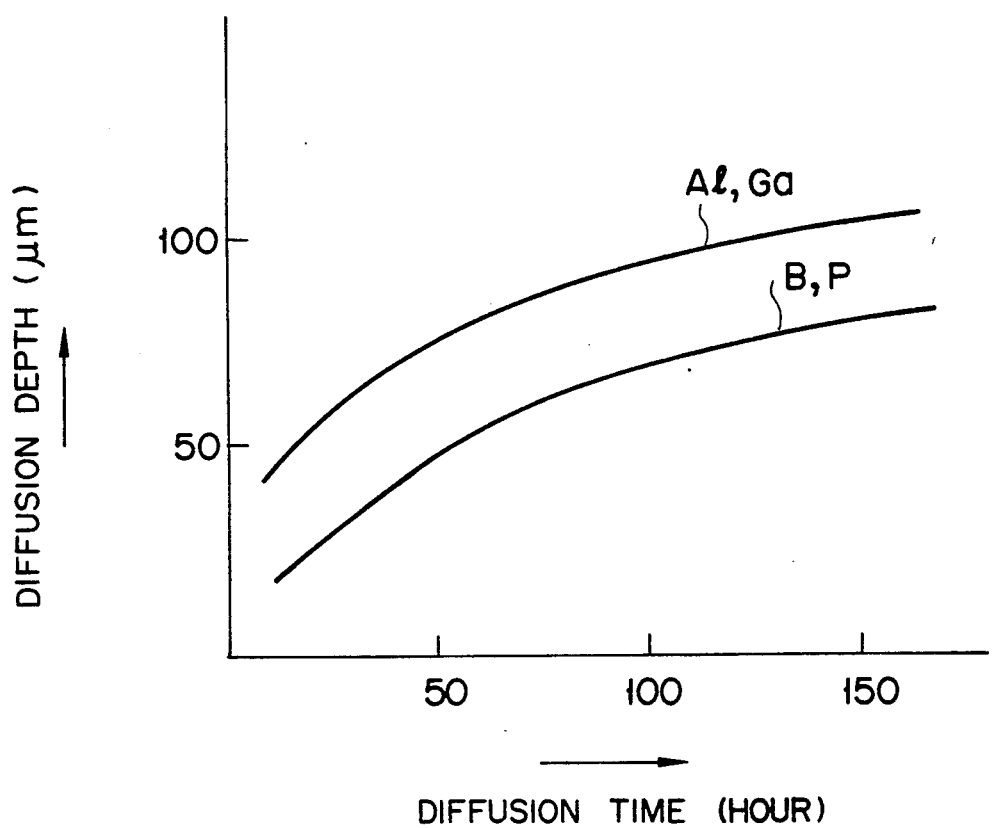
F I G. 7

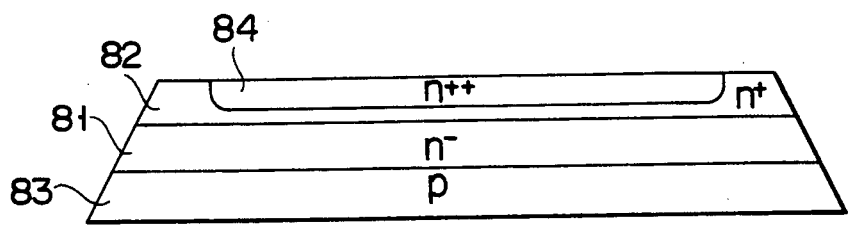
F I G. 11
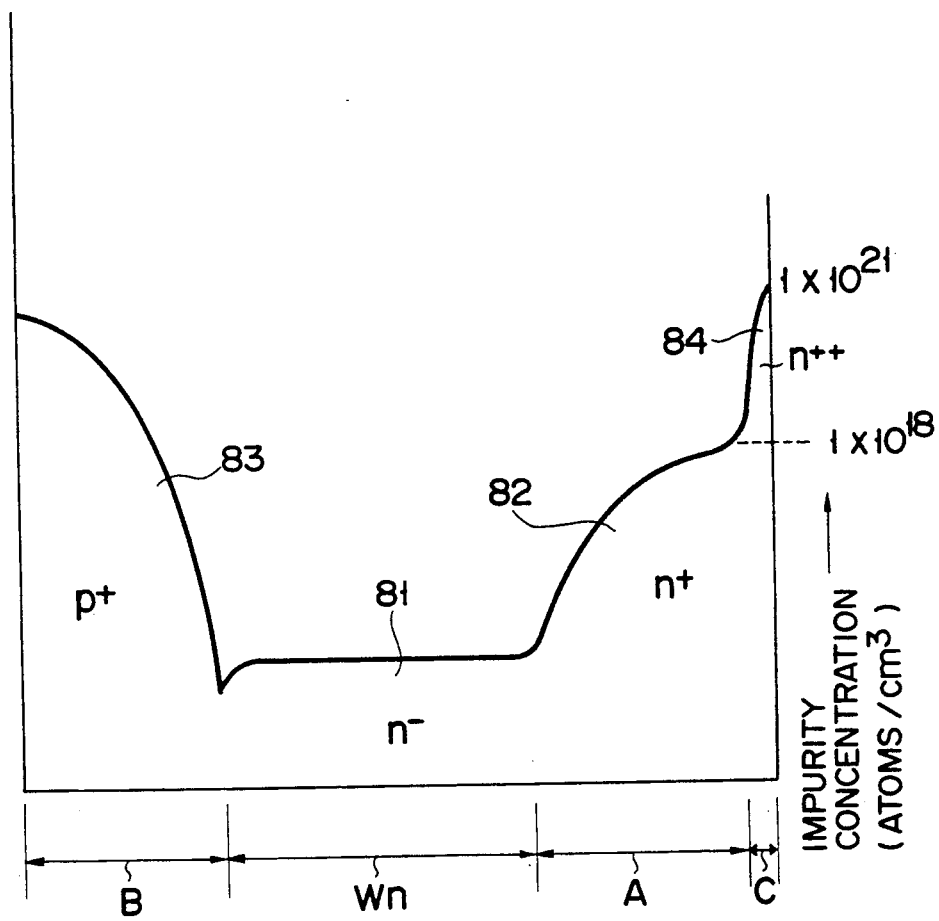
F I G. 12

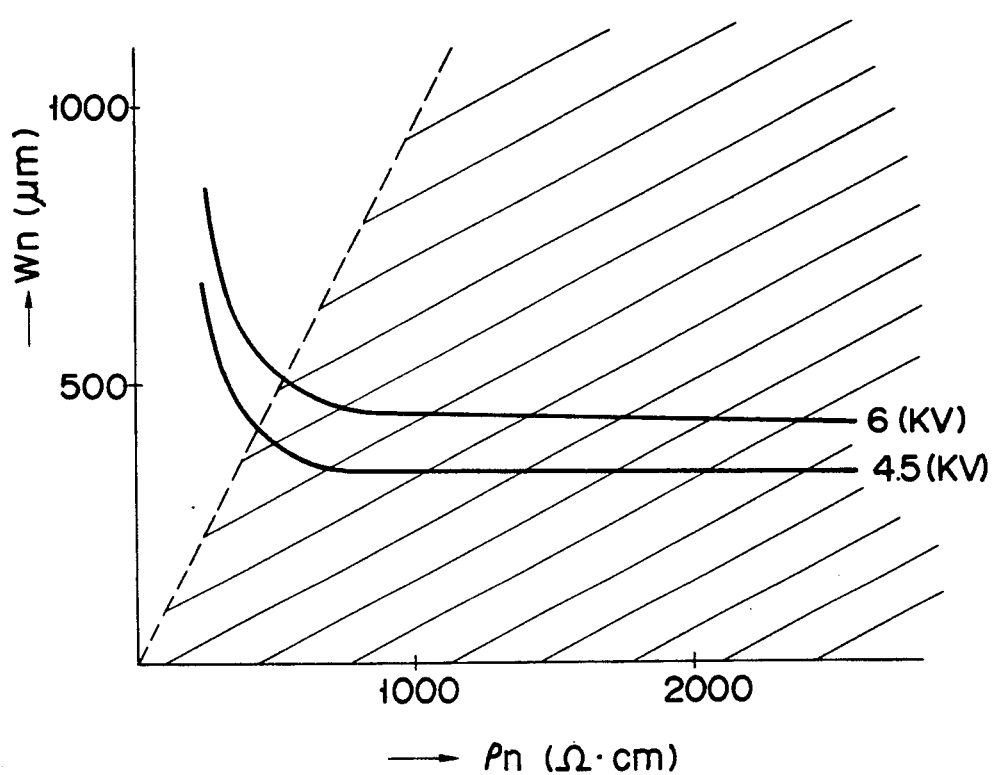
F I G. 13

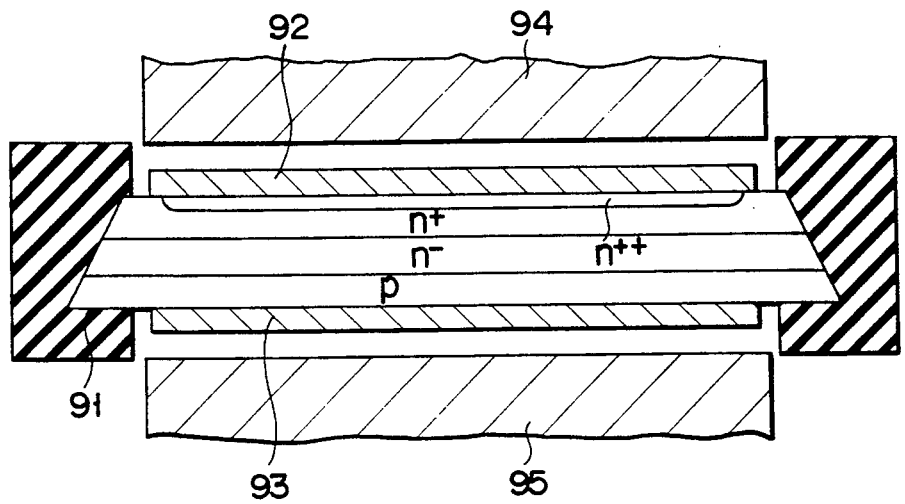
F I G. 14
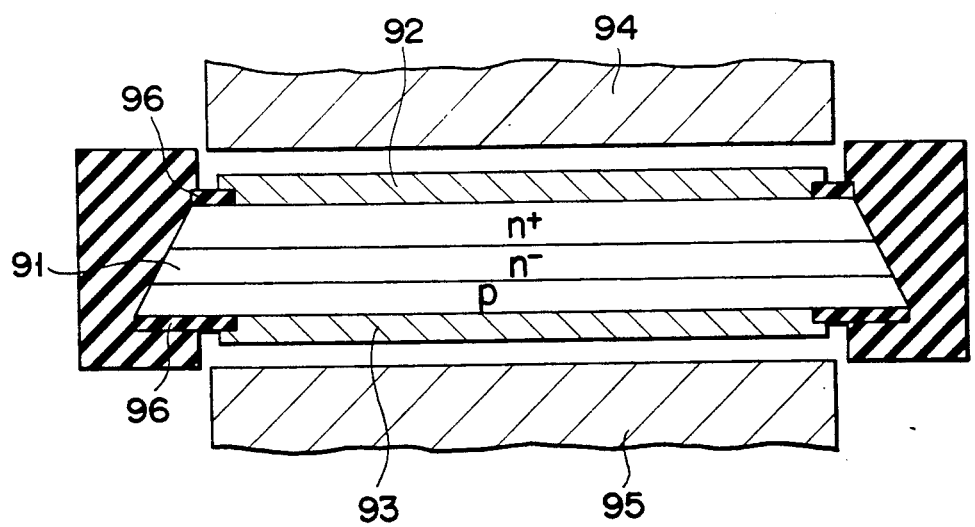
F I G. 15

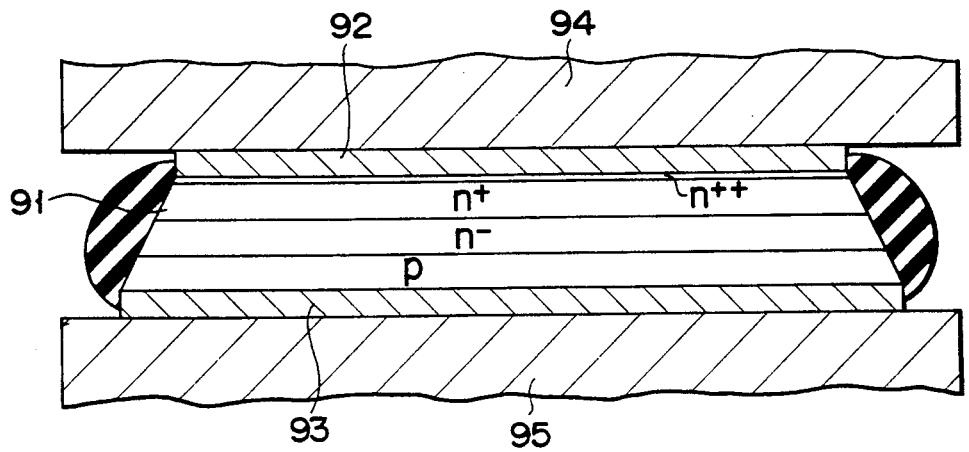
F I G. 16
| WITHSTAND VOLTAGE (V) | n-BASE LAYER THICKNESS (μm) | |
|---|---|---|
| | PRIOR ART | PRESENT INVENTION |
| 900 | — | 100 |
| 2500 | 500 | 200 |
| 4500 | 750 | 350 |
| 6000 | 850 | 500 |
| 8000 | 1400 | 650 |
F I G. 17

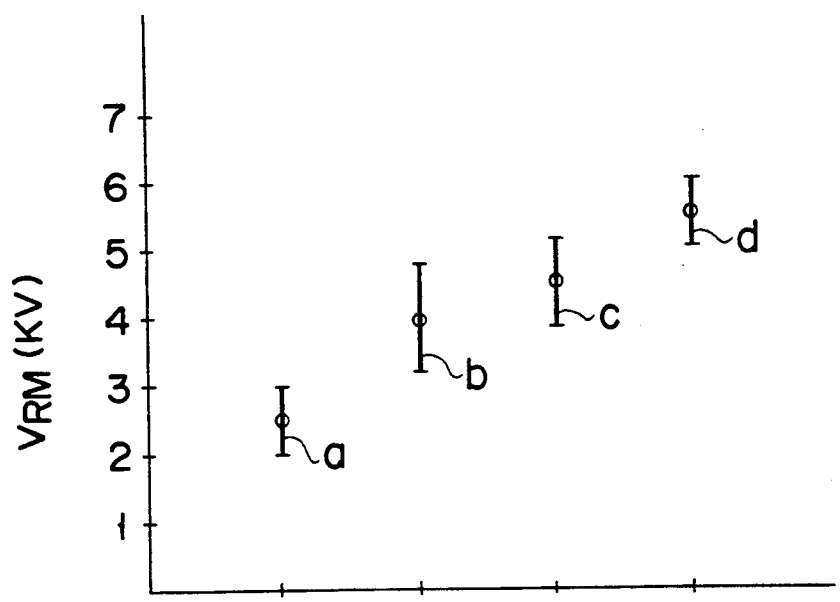
F I G. 18
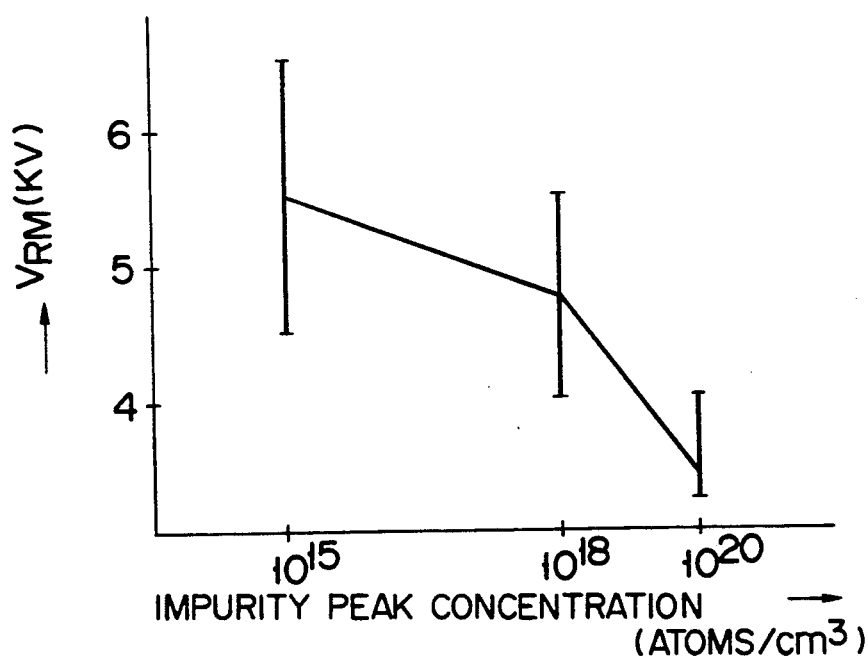
F I G. 19

METHOD OF MAKING A SEMICONDUCTOR DEVICE OF A HIGH WITHSTAND VOLTAGE

BACKGROUND OF THE INVENTION

1. Field of the Invention

The present invention relates to a semiconductor device of high withstand voltage and a method of manufacturing the same.

2. Description of the Related Art

Generally, in power semiconductor devices of a high withstand voltage and a large area, a p-type base must be deeply diffused into an n-type semiconductor wafer of a high sheet resistance to the depth of approximately 60 μm to 120 μm, for example. Since such a deep diffusion of p-type impurity is required, Al or Ga is generally used for the impurity for forming the n-type base of the power semiconductor device, taking a diffusion time and a uniformity of diffused impurity in a plane into consideration. Al or Ga rejects the selective diffusion by using an oxide film, however. For this reason, use of Al or Ga is inconvenient for manufacturing some specific types of power semiconductor devices such as PIN diodes and thyristors having low resistance n-type buffer layers and gate turn-off thyristors (GTOs).

A sectional view of a conventional GTO with an anode short structure using an n-type buffer layer, is shown in FIG. 1. An impurity profile with respect to a depth of impurity diffusion of the GTO is illustrated in FIG. 2. In FIG. 1, reference numeral 111 designates an n-base layer; 112 a p-base layer; 113 an n emitter layer; 114 an n buffer layer; 115 a p-emitter layer; 116 a cathode electrode; 117 an anode electrode; 118 a gate electrode.

As known, in the GTO having the n buffer layer as shown, presence of the n buffer layer allows the n-base layer to be thin in thickness. Accordingly, the GTO is improved in the on state-voltage and the switching characteristic. This type of the GTO, however, is disadvantageous in that the back-power withstand is remarkably reduced, and hence it is difficult to mass produce practical power semiconductor devices of high withstand voltage at a high production yield. A design of the n buffer layer of a low impurity concentration and a further depth of diffusion may cure the GTO of the above drawback to some extent. Such GTOs requires a long process to manufacture, and the manufactured GTOs are poor in reliability. This will be described in more details.

In ordinary GTOs of high withstand voltage, the p-base layer is formed by the diffusion of a impurity of a high diffusion efficiency, such as Al and Ga. A diffusion depth denoted as xjpb in FIG. 2 is ordinarily 60 to 120 μm. Accordingly, a sheet resistance pspb of the n emitter layer 113 after the n emitter layer 113 is formed is approximately 50 to 75 ohms/□. Thus, the diffusion depth xjpb is so deep. Further, a high withstand voltage of several thousands V must be obtained for a large area of 7 to 80 cm², for example. Al or Ga has a large diffusion coefficient, and therefore, when it is used for the impurity for the p-base layer, the diffusion will be completed for a relatively short time. It is for this reason that the material Al or Ga is used for forming the p-base layer 112. When this type of material is used, however, an oxide film that is to mask the entire surface of the structure cannot be used for preventing the "out-diffusion". A conventional process employed to cope with this is to simultaneously form the p-base layer 112 and the p-emitter layer 115. Another conventional process is to simultaneously form these layers, to remove the p-emitter layer, to form the n-buffer layer 114 or an anode-short, and finally to form a thin p-emitter layer.

In the latter process, when the diffusion layer closer to the anode is formed, an additional diffusion of boron is frequently performed, in order to prevent an impurity concentration in the surface region of the p-layer 112 from being reduced.

For forming the p-base layer 112, ion implantation of Al or Ga is frequently employed. In this case, in order to prevent the out diffusion, a film other than an oxide film, for example, a nitride film, is formed on the surface of the structure, and a p-base layer is formed by diffusion process.

Important factors to determine the characteristics of the GTO with the anode short structure containing the n-buffer layer a sheet resistance pspb of the p-base layer 112 and that of the n-buffer layer 114. See FIG. 2. A value of pspb of the p-base layer 112 depends on how a diffusion depth xjne of the n-emitter layer 113 is selected with respect to an impurity profile of the p-base layer 112. An accuracy of this diffusion is approximately ±0.5 μm, and the diffusion depth xjne greatly affects a production yield in the GTOs production. The present determination of this diffusion depth xjne consists of computing an impurity profile of the p-base layer for each lot of diffusion by a computer, and predicting the diffusion conditions for the diffusion depth xjne on the basis of the data thus far collected.

The profile control of the impurity concentrations of the p-base layer of Al or Ga formed by diffusion process fails to satisfy the design requirements. To cope with this, a special measure has been taken to satisfy the design requirements of the concentration impurity control. For the material or Al, the material is previously introduced onto the inner wall of the Si tube, a wafer is introduced into the tube, and it is heated to diffuse the material of Al into the wafer. For the material of Ga, a Ga-Ge diffusing method is used. These diffusing methods, however, are still unsatisfactory to secure the reproduction of an intended profile. To make up for this, the results of computation by a computer and the collected and accumulated data are used to stabilize the reproduction yield. Since the masking effect of an oxide film for a source of Al or Ga is unsatisfactory, it is customary to simultaneously form the p-base layer and the p-emitter layer. In the case of the GTO of FIG. 1, the p-base layer 112 and the p-emitter layer 115 must be 60 μm in width in preparation for the subsequent formation of the n-emitter layer 113. Accordingly, the width of the n-buffer layer 114 must be at 100 μm. This figure indicates that it is almost impossible to form such a wide n-buffer layer 114 cannot be formed by the diffusion process. By convention, an epitaxial growing method is often used for forming the n-buffer layer. The epitaxial layers formed by the method, however, are poor in the uniformity in the withstand voltages and in reliability, and increased in the number of process steps to manufacture the GTOs.

There is another method to manufacture the GTO in which the n-buffer layer 114 is formed by diffusing phosphorus, and the p-base layer is formed by ion implanting Al or Ga into the wafer and a subsequent diffusion of the impurity. In this method, a mask member other than the oxide film is required. The n-buffer layer of a low concentration cannot be diffused simultaneously with the p-base layer. At least two diffusion processes are required for forming a deep n-buffer layer, which increases the number of process steps.

In the GTO not having an n-buffer layer, the most important diffusion parameter to determine the characteristic after the base diffusion is only the sheet resistance pspb. In the GTO of the anode short structure using the n-buffer layer, both the sheet resistances of, pspb and psn must be considered after the base diffusion. The prior process has a limit of handling this.

SUMMARY OF THE INVENTION

Accordingly, an object of the present invention is to provide a high withstand voltage semiconductor device of a high reliability.

Another object of the present invention is to provide a method of manufacturing reliable semiconductor devices of high withstand voltage without any increase of the number of process steps.

According to one aspect of the present invention, there is provided a semiconductor device of high withstand voltage comprising:

an n-type first semiconductor layer of high sheet resistance;

a p-type second semiconductor layer doped with boron as an impurity, said second semiconductor layer being formed in a first major surface of said first semiconductor layer;

an n-type third semiconductor layer doped with phosphorus as an impurity, said second semiconductor layer being formed in a second major surface of said first semiconductor layer; and an n-type fourth semiconductor layer of a high concentration being formed in the surface of said third semiconductor layer.

According to another aspect of the present invention, there is provided a method of manufacturing semiconductor devices of high withstand voltage comprising:

a first step of introducing an impurity of boron into a first major surface of an n-type first semiconductor layer of high sheet resistance and an impurity of phosphorus into a second major surface of said first semiconductor layer; and a second step of forming a second semiconductor layer of p-type in said first major surface of said first semiconductor layer and a third semiconductor layer of n-type in said second major surface of said first semiconductor layer by diffusing said impurities into said first and second surfaces of said first semiconductor layer.

According to yet another aspect of the present invention, there is provided a method of manufacturing semiconductor devices of high withstand voltage comprising:

a first step of introducing an impurity of boron into a first major surface of an n-type base layer of high sheet resistance and an impurity of phosphorus into a second major surface of said base layer;

a second step of simultaneously forming a p-type base layer in said first major surface of said base layer and an n-type buffer layer in second major surface of said base layer by diffusing said impurities into said first and second major surfaces of said base layer;

a third step of introducing different types of impurities of different conductivity types into said p-type base layer and said n-type buffer layer; and a fourth step of simultaneously forming an n-type emitter layer in said p-type base layer, and a p-type emitter layer and an n-type anode short layer in said n-type buffer layer by diffusing said impurities as introduced in said third step.

BRIEF DESCRIPTION OF THE DRAWINGS

FIG. 2 shows a profile of impurity concentrations in the GTO of FIG. 1 with respect to a depth of the GTO;

FIGS. 4 through 4H show sectional views for explaining in detail a sequence of the process steps according to the manufacturing method of FIG. 3;

FIGS. 5A through 5D show a sequence of process steps to manufacture semiconductor devices of high withstand voltage according to another embodiment of the present invention;

FIGS. 6A through 6E show sectional views for explaining in detail a sequence of the process steps according to the manufacturing method of FIG. 5;

FIG. 7 shows a graphical representation a diffusion depth vs. diffusion time characteristic of each of the semiconductor device of high withstand voltage manufactured according to the above-mentioned embodiments;

FIG. 11 shows a sectional view of a PIN diode according to the present invention;

FIG. 12 shows a graphical representation of an impurity concentration profile of the PIN diode of FIG. 11;

FIG. 13 shows a graphical representation of a width vs sheet resistance relationship of an n-base layer of the PIN diode;

FIGS. 14 to 16 show sectional views of PIN diodes according to the present invention;

FIG. 17 shows a table comparatively showing relationships between withstand voltages and thicknesses of an n-base layer of semiconductor devices of prior art and according to the present invention;

FIG. 18 shows back power withstand voltage characteristics of the semiconductor devices of prior art and according to the present invention;

FIG. 19 shows a graphical representation showing relationships of a back power withstand voltage vs. a peak concentration of an impurity of the n-buffer layer according to the respective embodiments of the present invention;

DETAILED DESCRIPTION OF THE PREFERRED EMBODIMENTS

A method of manufacturing a semiconductor device of high withstand voltage according to the present invention is based on the fact that the diffusion coefficient of boron as a p-type impurity is near that of phosphorus as a p-type impurity at a design concentration. In the present invention, two diffusion sources are simultaneously diffused to simultaneously form a p-type base layer in one of the major surfaces of an n-type base layer and an n-type buffer layer in the other surface of the n-type base layer. Boron and phosphorus of relatively low concentration have smaller diffusion coefficients than Al or Ga, and are usually not used for a deep diffusion. The present invention actively utilizes this nature of the low diffusion coefficient of boron and phosphorus. More specifically, when boron or phosphorus is compared with Al or Ga, to diffuse these impurities up to a depth, a diffusion time of the former is approximately two times that of the latter or the former requires a higher diffusion impurity than the latter. This fact indicates that once the p-type base layer and the n-type buffer layer are formed, a subsequent diffusion will little change the impurity profiles. In other words, a reproducibility of the p-type base layer and the n-type buffer layer is good, and the slumping conditions for the n-emitter layer, p-emitter layer, and anode short can be fixed, so that these may be simultaneously formed.

Since the p-type base layer and the n-type buffer layer are formed through the diffusion of boron and phosphorus, the masking by an oxide film is allowed and the additional diffusion is easy. Further, the diffusion time is long, and an accuracy of diffusion is improved.

A method of manufacturing semiconductor devices of high withstand voltage according to the present invention will be described. A sequence of process steps to manufacture GTOs of the anode short structure with an n-buffer layer according to the present invention are shown in FIGS. 3A through 3C.

Figure 1:
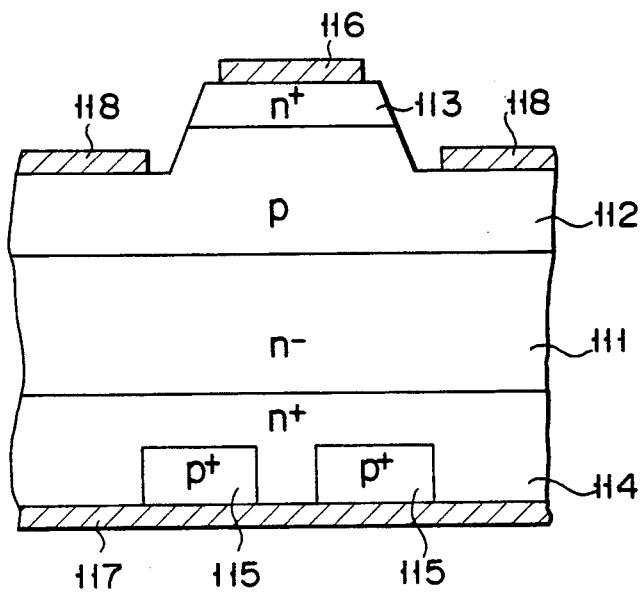
FIG. 1 shows a partial sectional view of a conventional GTO of the anode short structure.
Figure 3A:
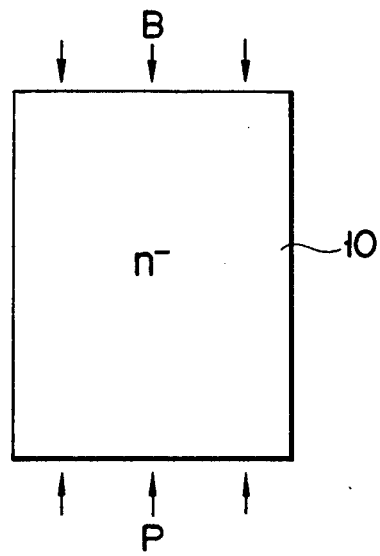
FIGS. 3A through 3C show a sequence of process steps to manufacture semiconductor devices of high withstand voltage according to an embodiment of the present invention.
Figure 3B:
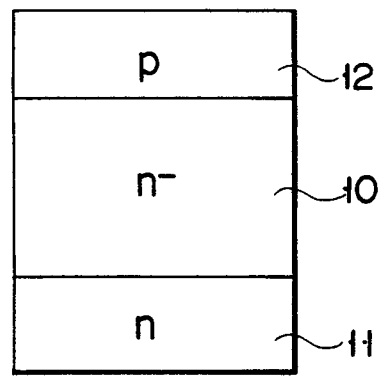

As shown in FIG. 3A, phosphorus as an n-type impurity is doped into one of the major surfaces of an n-type silicon semiconductor substrate 10, and boron as a p-type impurity, into the other major surface of the same. Either of the impurities, phosphorus and boron may first be doped.

Then, the substrate doped with the impurities is subjected to long time thermal diffusion process at a high temperature. As the result of the thermal diffusion process, an n-buffer layer 11 is formed in one of the major surface regions of the substrate 10 and a p-base layer 12 in the other major surface region, as shown in FIG. 3B. For such a long time and high temperature thermal diffusion process, a diffusion tube made of SiC is available, and a pretreatment of the substrate and the optimization of buffer gas being diffused may prevent increase of crystal defects. In this case, a mixture of oxygen gas and nitrogen gas may be used for the buffer gas. For the buffer gas optimization, a mixing ratio, flow rate, degree of clearness and the like are appropriately adjusted.

Figure 3C:
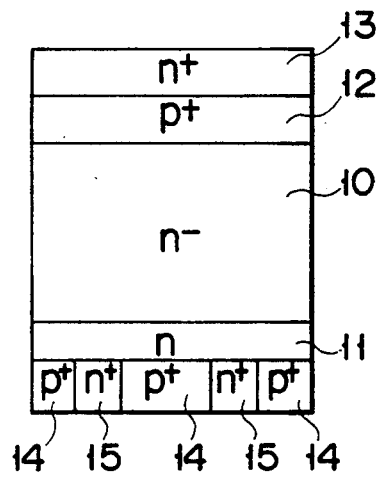

As shown in FIG. 3C, n-type impurity is diffused into the surface region of a p-base layer 12, to form an n-emitter layer 13. P-type impurity is diffused into the surface region of an n-buffer layer 11, for form p-type emitter layers 14. Further, n-type impurity is diffused into the surface region of the n-buffer layer 11, to form n-type anode short layers 15. At this point, the power semiconductor device is completed. It is noted here that when the n-emitter layer 13, p-emitter layer 14, and anode short layer 15 are formed, the impurity concentration profiles of the boron in the p-base layer 2 and of the phosphorus in the n-buffer layer 11 are little changed. Therefore, the reproducibility of the p-base layer 12 and the n-buffer layer 11 is excellent. This implies that before the n-emitter layer 13, p-emitter layer 14, and anode short layer 15 are formed by the diffusion, the slumping conditions at the time of ion implantation of impurities can be fixed, and the impurities for those layers may be simultaneously diffused.

In the simultaneous diffusion of the p-base layer 12 and the n-buffer layer 11, the diffusion time is long and therefore, the depths of both the layers can be set with a high precision. Accordingly, the semiconductor devices of high withstand voltage manufactured are improved in reliability, and can be manufactured without any increase of process steps to manufacture. Further, the selective diffusion is possible with only the masking by an oxide film. In the high withstand voltage semiconductor devices coupled with a diode, for example, such as reverse conducting GTOs, the GTO per se, together with the diode, can be formed in the same chip.

FIGS. 4A through 4H show sectional views showing the details of the manufacturing method as mentioned above. Phosphorus of n-type is implanted, at the dosage of $1 \times 10^{12}$ to $1 \times 10^{14}$ (atoms/cm$^2$), into the surface region of one of the major surfaces of an n-type silicon semiconductor substrate 10 whose sheet resistance is 600 to 800 ohm.cm (FIG. 4A).

Then, p-type boron is implanted into the surface region of the other major surfaces at the dosage of $1 \times 10^{14}$ to $1 \times 10^{16}$ (atoms/cm$^2$) (FIG. 4B). The acceleration voltage used for both the ion implantions was 50 keV.

A pre-drive-in process is performed. In the process, the substrate 10 is entirely heated at 1200° C., so that an n-layer 21 is formed in the surface region of the one of the major surfaces, while a p-layer 22, in the surface region on the other major surface (FIG. 4C). The pre-drive-in process is performed for a much shorter and at a lower temperature than a main-drive-in process that follows the pre-drive-in process. Different pre-drive-in processes may be applied for the layers 21 and 22.

After the removal of an oxide film formed during the preceding pre-drive-in process, the entire structure is oxidized, so that an oxide film 23 of 2.5 μm thick, for example, is formed over the entire surface of the structure (FIG. 4D). With the oxide film formed in the pre-drive-in process being left as it is, the resultant structure may be oxidized to form the aforementioned oxide film 23.

A main-drive-in process is performed at 1250° C. using an SiC tube, for example. The n-layer 21 and the p-layer 22 are simultaneously diffused, so that an n-buffer layer 11 and a p-base layer 12 are formed (FIG. 4E).

Then, the oxide film 23 is removed. Then, the structure is oxidized anew to form another oxide film 24 of 2.5 μm thick, for example. The oxide film 24 on the n-buffer side is opened to form holes corresponding to the anode short layers. The oxide film on the p-base side is completely removed. Using the remaining oxide film 24 as a mask, n-type impurity is introduced into the n-buffer layer 11 and the p-base layer 12 (FIG. 4F).

Subsequently, the oxide film 24 on the anode short side is completely removed, and then p-type impurity is introduced into the n-buffer layer 11. In this case, if an impurity concentration of the n-type impurity layer as previously and selectively introduced is satisfactorily high, a mask for the n-type impurity is not required in particular (FIG. 4G).

Thereafter, the structure is diffused at temperature of 1200° C., for example, to form an n-emitter layer 13, p-emitter layers 14, and anode short layers 15 (FIG. 4H).

FIGS. 5A through 5D show a sequence of process steps to manufacture a GTO according to another manufacturing method according to the present invention.

As shown in FIG. 5A, phosphorus of n-type is doped into one of the major surfaces of an n-type silicon semiconductor substrate 10, and boron of p-type is doped into the other major surface of the same. Either of the impurities, phosphorus and boron may first be doped.

Then, the substrate doped with the impurities is subjected to long time thermal diffusion process at a high temperature. As the result of the thermal diffusion process, an n-buffer layer 11 is formed in one of the major surfaces of the substrate 10 and a p-base layer 12 in the other major surface, as shown in FIG. 5B.

Then, as shown in FIG. 5C, p-emitter layers 14 are formed by diffusing a p-type impurity into the n-buffer layer 11.

Further, as shown in FIG. 5D, an n-type impurity is diffused into the p-base layer 12, to form an n-emitter layer 13. At the same time, an n-type impurity is diffused into the n-buffer layer 11, to form n-type anode short layers 15.

According to this method, the sheet resistance pspb of the p-base layer 12 and the sheet resistance psn of the n-buffer layer 11 may be controlled separately. It is noted here that this fact implies that a substrate after it is subjected to the base diffusion process may be used commonly for the formations of many different types of semiconductor devices, for example, different types of GTOs, and the subsequent diffusion process is appropriately conditioned to form different types of semiconductor devices.

FIGS. 6A through 6E are sectional views showing the details of the manufacturing process of FIG. 5.

In this method, the steps of FIGS. 4A through 4E are the same as those of the above-mentioned embodiment. Thereafter, the structure is entirely oxidized to form an oxide film 26 of, for example, 2.5 μm thick. The formed oxide film 26 is opened to form openings corresponding to the anode short layers. Subsequently, boron ions are implanted through the openings at 50 KeV of acceleration energy and $1 \times 10^{16}$ (atoms/cm$^3$) of dosage (FIG. 6A).

Subsequently, the diffusion is performed to form p-emitter layers 14 (FIG. 6B).

The oxide film 26 is removed and another oxide film 27 is applied over the entire surface of the structure (FIG. 6C).

The formed oxide film 27 is opened to form openings at the locations corresponding to the anode short layers. The same oxide film 27 on the p-base layer side is removed to expose the p-base layer 12. Then, by the vapor doping process, an n-type impurity is introduced into the surface of the n-buffer layer 11 and the p-base layer 12 (FIG. 6D).

Subsequently, the structure is placed at temperature of 1200° C., for example, thereby to form the n-emitter layer 13 and the anode short layers 15 (FIG. 6E).

In the GTOs thus manufactured, the sheet resistances psp of the p-base layer 12 after the diffusion were varied within ±0.8 ohm/; the depths xjp of the p-base layer 12, within ±1 μm; a life time of each n-base layer 10 was 100 μs or more. When comparing those figures with ±4 ohm/, ±3 μm, and 70 μs of the conventional GTOs, it is apparent that the GTOs according to the present invention are remarkably improved over the conventional GTOs. Variations of the sheet resistances and the diffusion depths of the n-buffer layer 11 were also more reduced.

In another conventional method of manufacturing semiconductor device of high withstand voltage in which the n-buffer layer is formed by the diffusion of phosphorus and the p-base layer, by the diffusion of Al or Ga, the first diffusion of phosphorus takes 80 hours at 1250° C., and the diffusion of Al or Ga and another diffusion of phosphorus take 80 hours at 1200° C. The diffusion times are totally 160 hours. The manufacturing method according to the present invention needs only 80 times and 1250° C. for the diffusions of those layers. Thus, the diffusion time is halved.

FIG. 7 is a graphical representation of relationships of diffusion depth vs. diffusion time of Al Ga, boron and phosphorus measured in the conditions that those impurities were at a concentration required for the high withstand voltage semiconductor devices, e.g., at dosage of $1 \times 10^{14}$ (atoms/cm$^2$), and a diffusion temperature was 1250° C. The graph shows that of those impurities, only the boron can attain a diffusion depth comparable with that of the phosphorus when it is diffused simultaneously with the phosphorus. Further, Al and Ga can attain an intended depth when it is diffused separately from phosphorus.

Figure 8A:
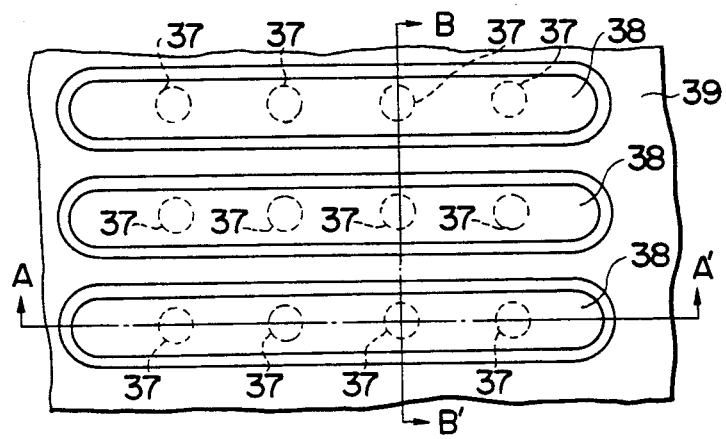
FIG. 8A shows a partial plan view of a GTO manufactured according to either of the above-mentioned embodiments.
Figure 8B:
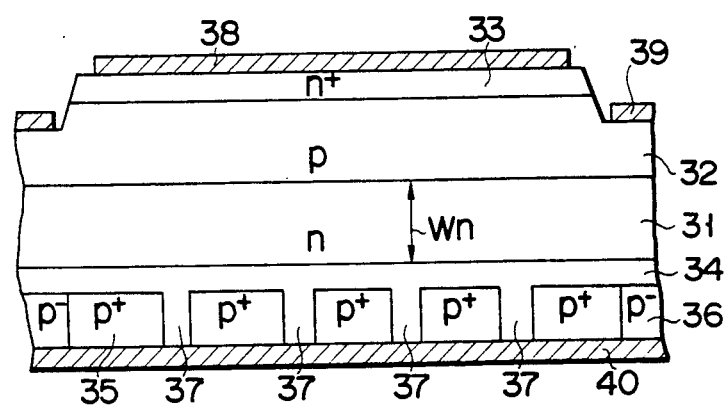
FIGS. 8B and 8C show sectional views taken on lines A—A' and B—B' in FIG. 8A, respectively.
Figure 8C:
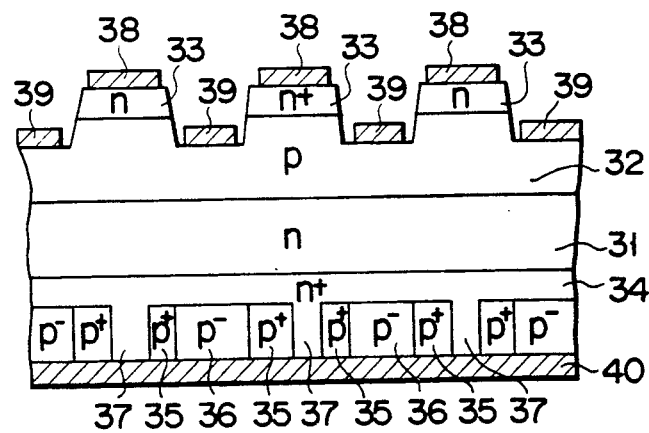

FIG. 8 shows a structure of a GTO of the anode short structure with an n-buffer. FIG. 8A shows a plan view of the GTO as viewed from the cathode side. FIGS. 8B and 8C show sectional views taken on lines A—A' and B—B', respectively. In the figure, reference numeral 31 designates an n-base layer; 32 a p-base layer; 33 narrow split n-emitter layers; 34 an n-buffer layer; 35 p-emitter layers at high concentration; 36 p-emitter layers at low concentration each surrounding the high concentration p-emitter layer 35; 38 a cathode electrode; 39 a gate electrode; 40 an anode electrode. In this GTO, the higher the sheet resistance of the n-base layer 31 is, the thinner the n-base layer 31 may be. The thinning of the n-base layer would improve a trade-off among the reverse restoration time and the forward on state-voltage. A rate of the trade-off improvement is unfixed, and is saturated at a value. The experiment showed that when $pn/Wn \geq 1 \times 10^4$ where pn is a sheet resistance of the n-base layer 31, and Wn is a width of the layer 31 (FIG. 8B), the improvement of the trade-off was satisfactory.

Figure 9:
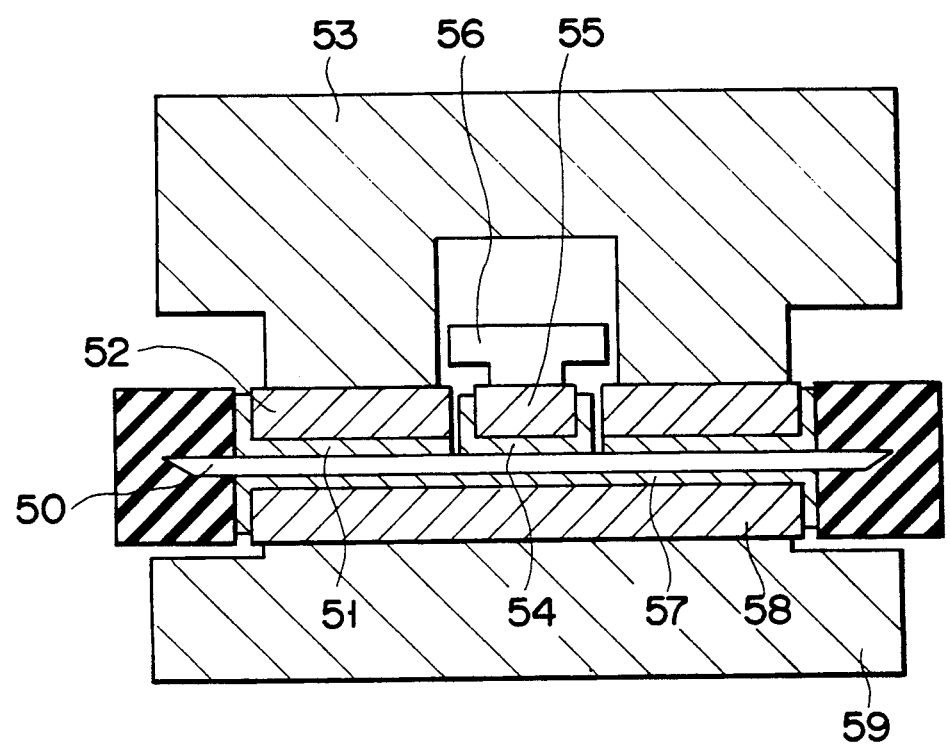
FIG. 9 shows a sectional view of a pellet into which the semiconductor device of FIG. 8 is assembled.

FIG. 9 shows a sectional view of an assembly containing the GTO of FIG. 8. In the figure, reference numeral 50 represents a GTO pellet. A cathode electrode of the GTO pellet 50 is connected to a post 53 made of Cu through an Ag foil 51 and a thermal stress compensator 52 of Mo. A gate electrode of the GTO pellet 50 is connected to a post 56 of Cu through an Ag foil 54 and a heat buffering plate 55 of Mo. An anode electrode of GTO pellet 50 is connected to a post 59 of Cu through an Ag foil 57 and a thermal stress compensator 58 of Mo.

The above structure of the semiconductor devices is called an alloyless structure which is not provided with a thermal stress compensator made of a material such as W and Mo to be alloyed with the pellet. If the alloyless structure is employed, the GTO pellets can be manufactured by the same production line as that used for the pellet process of other semiconductor devices such as ICs. The result is a remarkable improvement of a productivity in the semiconductor device production and a reliability of the manufactured semiconductor devices.

Figure 10:
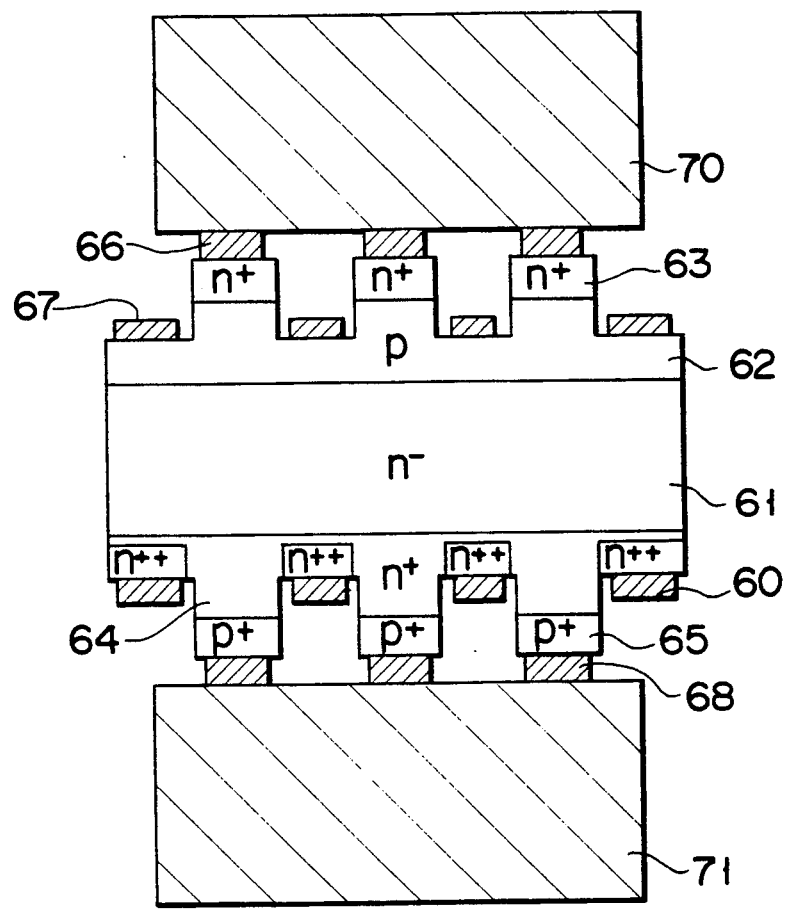
FIG. 10 shows a sectional view of a GTO manufactured according to either of the above-mentioned embodiments.

FIG. 10 shows a sectional view of a double gate GTO of the anode short structure with an n-buffer that is manufactured according to a semiconductor device manufacturing method according to the present invention. In the figure, reference numeral 61 denotes an n-base layer; 62 a p-base layer; 63 split n-emitter layers; 64 an n-buffer layer; 65 split p-emitter layers; 66 a cathode electrode; 67 a first gate electrode; 68 an anode electrode; 69 a second gate electrode; 70 and 71 posts made of Cu.

A semiconductor device manufacturing method according to the present invention is applicable for manufacturing diodes.

FIG. 11 is a sectional view showing a structure of a PIN diode manufactured by a manufacturing method according to the present invention. FIG. 12 shows an impurity profile of the PIN diode. The diode may be manufactured in a manner that phosphorus is introduced into one of the major surfaces of an n-base layer 81, and boron into the other major surface by ion implantation process, for example, and those impurities are diffused at high temperature of 1250° C., for example, to simultaneously form an n-buffer layer 82 and a p-base layer 83 on both the sides of the n-base layer 81. In the ion implantation of phosphorus, a dosage of implanted ions is selected so that an impurity concentration in the surface region of the n buffer layer 82 is less than $1 \times 10^{18}$ (atoms/cm$^3$). Thereafter, an n-type impurity is introduced into the surface region of the n-buffer layer 82, and diffused thereinto, so that a low resistance n-type layer 84 at a high concentration serving as an electric field stopper or taking an ohmic contact is formed in the surface region of the n-buffer layer 82. Before the low resistance n-type layer 84 is formed, a dosage of the impurity ion to be implanted is selected so that an impurity concentration in the surface region of the layer 84 is $1 \times 10^{21}$ (atoms/cm$^3$). A diffusion depth A of the n-buffer layer 82 in FIG. 12 is set at approximately 70 μm, which is substantially equal to that B of the p-base layer 83. The diffusion depth C of the low resistance n-type layer 84 is set within the range of 5 to 30 μm.

In the PIN diode with the impurity profile as described above, a concentration of the n-buffer layer 82 is low and hence this layer is set at a relatively high resistance. It has been empirically confirmed that in the case of the diode in which the resistance of the n-buffer layer 82 is set at a high value, a back-power withstand may be set to be satisfactorily large.

The higher the sheet resistance of the n-base layer 81 is, the thinner the n-base layer 81 may be. The thinning of the n-base layer would improve a trade-off among the reverse restoration time and the forward on state-voltage. A rate of the trade-off improvement is unfixed, and is saturated at a value. The experiment showed that when pn/Wn ≧ $1 \times 10^4$ where pn is a sheet resistance of the n-base layer 81, and Wn is a width of the layer 81, the improvement of the trade-off was satisfactory.

Additionally, it was confirmed that if a life time τ of the n-base layer 81 was set within 1 to 100 μs, the improvement of the trade-off became easy.

FIG. 13 shows relationships between a sheet resistance pn and a width Wn of the n-base layer 81 in the PIN diode having an impurity profile as shown in FIG. 12. The relationships of two types of diodes whose withstand voltages are 6 KV and 4.5 KV are illustrated. The above relation of pn/Wn is satisfied in a shaded area of the graph of FIG. 13. In other words, if the values of pn and Wn are selected within the shaded area, the trade-off between the reverse restoration time and the forward on state voltage can be improved.

In the above PIN diode, one of the reasons for reducing the back-power withstand is that heat is ineffectively transferred from the pellet to the Cu post. In the PIN diode of the type in which the pellet indirectly contacts the post, there is the possibility that heat will be accumulated while being little radiated.

FIGS. 14 to 16 show other PIN diodes which are improved in the trade-off between the reverse restoration time and the forward on state voltage of the pellet per se, and further in the back-power withstand performance. The former improvement arises from employment of an impurity profile as shown in FIG. 12. The latter improvement is due to the fact that the diode assembly is structured so as to be able to effectively radiate the heat internally generated.

The diode of FIG. 14 is designed so as to make uniform a heat distribution and a current density distribution on the surface of a pellet 91. To this end, upper and lower electrodes 92 and 93 are made of Al and contact with the pellet 91 through an Ag foil and thermal stress compensator of Mo, not shown, and upper and lower posts 94 and 95 that are made of Cu and contact with the metal plates, are symmetrically configured.

The diode of FIG. 15 is so designed that oxide films 96 are circumferentially laid on both the major surfaces of a pellet 91, so as to prevent a current from flowing between the oxide films 96.

In the diode of FIG. 16, Cu posts 94 and 95 are large enough to radiate a satisfactory amount of heat.

FIG. 17 comparatively tabulates relationships of withstand voltages vs. thickness of the n-base layer of a PIN diode having an impurity profile as shown in FIG. 12 and that of a conventional diode. As seen from the table, the PIN diode according to the present invention allows use of a thinner n-base layer.

FIG. 18 shows back-power withstand voltages of PIN diodes having the FIG. 12 profile and a conventional diode. In the figure, "a" designates the back-power withstand voltage of the conventional diode, and "b" to "d" those of the PIN diodes according to the present invention. As seen from the graph, as for the back-power withstand voltage, the PIN diodes are superior to the conventional diode.

FIG. 19 is a graph showing a relationship of a back-power withstand voltage vs. impurity peak concentration in the n-buffer layer. As shown, when this impurity peak concentration exceeds $1 \times 10^{18}$ (atoms/cm$^3$), the back-power withstand voltage sharply drops. Therefore, to obtain a satisfactory back-power withstand voltage, the impurity peak concentration in the n-buffer layer must be set to be below $1 \times 10^{18}$ (atoms/cm$^3$).

Figure 20:
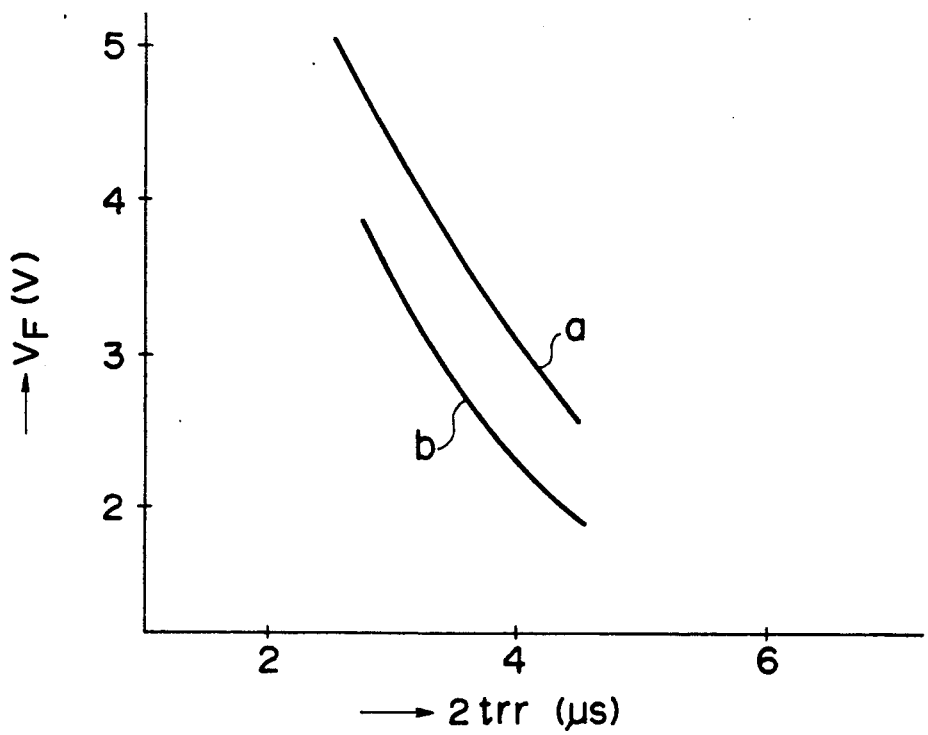
FIG. 20 comparatively shows relationships of a high temperature reverse restoration time vs. forward voltage of semiconductor devices of prior art and according to the present invention.

FIG. 20 shows relationships of a forward voltage VF (V) versus high temperature, reverse restoration time 2trr (μs) of the PIN diode having the FIG. 12 profile and a conventional diode. In the figure, a curve "a" indicates the VF vs. 2trr relationship of the conventional diode, and a curve "b", that of the PIN diode according to the present invention. The graph shows that the PIN diode according to the present invention is improved in both the high temperature, reverse recovery time 2trr and the forward voltage $V_F$.

Figure 21:
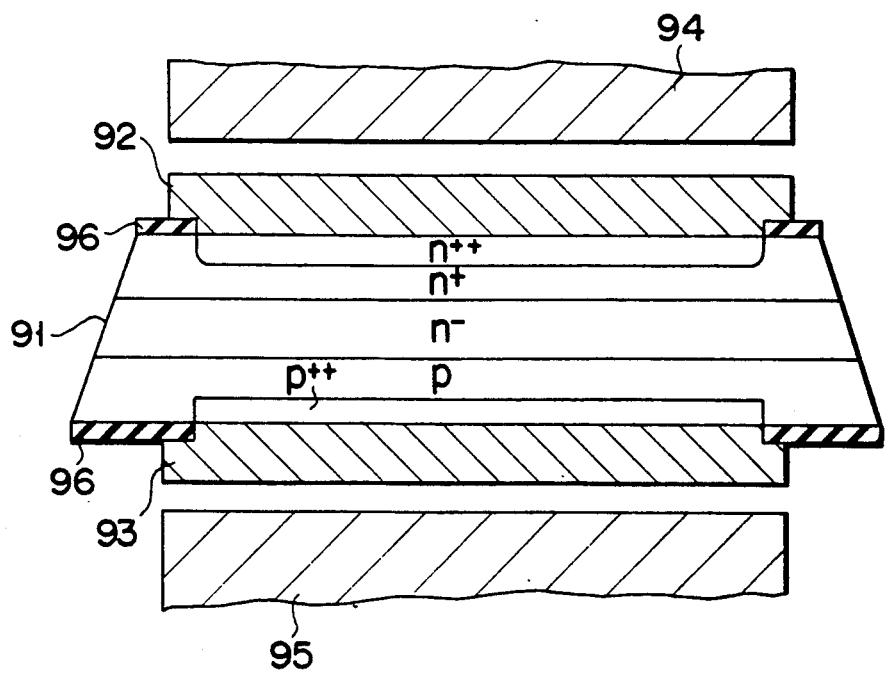
FIG. 21 shows a sectional view of a semiconductor device of high withstand voltage according to a further embodiment of the present invention.

FIG. 21 shows a sectional view showing a structure of a PIN diode according to another embodiment of the present invention. In the PIN diode, the FIG. 12 impurity profile is used. Upper and lower metal plates 92 and 93 that are made of Al and directly contact with the pellet 91 and upper and lower posts 94 and 95 that are made of Cu and contact with the metal plates, are symmetrically configured. Oxide films 96 are circumferentially laid on both the major surfaces of a pellet 91, so as to prevent a current from flowing between the oxide films 96.

As seen from the foregoing description, the present invention has successfully provided a semiconductor device of high withstand voltage that, together with another element, may be fabricated into a single chip. Additionally, the present invention has succeeded in providing a method of manufacturing a reliable semiconductor device of high withstand voltage without any increase of process steps to manufacture.

What is claimed is:

1. A method of manufacturing semiconductor devices of high withstand voltage, comprising:
    a first step of introducing an impurity of boron into a first major surface of an n-type base layer and an impurity of phosphorus into a second major surface of said n-type base layer by an ion implanting method;
    a second step of simultaneously pre-drive-in diffusing both of said impurities by heating them at a selected temperature;
    a third step of simultaneously diffusing both said impurities for a longer time and at a high temperature than those in said pre-drive-in diffusion, to thereby simultaneously form a p-type base layer in the first major surface of said n-type base layer and an n-type buffer layer in the second major surface of said n-type base layer;
    a fourth step of introducing, by using predetermined masks, an n-type impurity into the entire surface of said p-type base layer and a p-type impurity into the surface of said n-type buffer layer; and
    a fifth step of forming an n-type emitter layer in said p-type base layer and a p-type emitter layer in said n-type buffer layer, by diffusing each of the impurities included in said fourth step.

2. A method of manufacturing semiconductor devices of high withstand voltage, comprising:
    a first step of introducing an impurity of boron into a first major surface of an n-type base layer and an impurity of phosphorus into a second major surface of said n-type base layer by an ion implanting method;
    a second step of simultaneously pre-drive-in diffusing both of said impurities by heating them at a selected temperature;
    a third step of simultaneously diffusing both said impurities for a longer time at a higher temperature than those in said pre-drive-in diffusion, to thereby simultaneously form a p-type base layer in the first major surface of said n-type base layer and an n-type buffer layer in the second major surface of said n-type base layer;
    a fourth step of introducing, by using predetermined masks, an n-type impurity into the entire surface of said p-type base layer and a p-type impurity into a selected part of the surface of said n-type buffer layer;
    a fifth step of introducing an n-type impurity into the entire surface of said n-type buffer layer; and
    a sixth step of simultaneously forming an n-type emitter layer in said p-type base layer and a p-type emitter layer and an n-type anode short layer in said n-type buffer layer, by diffusing each of the impurities introduced in said fourth and fifth steps, said anode short layer being shallower than said p-type emitter layer.

* * * * *

UNITED STATES PATENT AND TRADEMARK OFFICE
CERTIFICATE OF CORRECTION

PATENT NO.　：　5,156,981
DATED　　　：　October 20, 1992
INVENTOR(S)：　Mitsuhiko KITAGAWA et al.

It is certified that error appears in the above-identified patent and that said Letters Patent is hereby corrected as shown below:

Claim 1, column 11, line 35, change "high" to --higher--.

Signed and Sealed this

Eighteenth Day of January, 1994

Attest:

BRUCE LEHMAN

*Attesting Officer*　　　　*Commissioner of Patents and Trademarks*